(12) United States Patent
Rosenberg et al.

(10) Patent No.: US 6,559,724 B2
(45) Date of Patent: May 6, 2003

(54) TECHNIQUES FOR ENHANCING GAIN IN A QUASI-OPTIC GRID ARRAY

(75) Inventors: James J. Rosenberg, Monrovia, CA (US); Blythe C. Deckman, Corona, CA (US); David B. Rutledge, Pasadena, CA (US); Michael P. DeLisio, Jr., Monrovia, CA (US); Chun-Tung Cheung, Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 0 days.

(21) Appl. No.: 09/876,210

(22) Filed: Jun. 5, 2001

(65) Prior Publication Data

US 2002/0024719 A1 Feb. 28, 2002

Related U.S. Application Data

(60) Provisional application No. 60/211,252, filed on Jun. 13, 2000.

(51) Int. Cl.[7] .............................................. H03F 3/08
(52) U.S. Cl. ................................. 330/308; 330/260
(58) Field of Search ............................. 330/252, 253, 330/260, 295, 308; 250/214 A

(56) References Cited

U.S. PATENT DOCUMENTS

| | | | | |
|---|---|---|---|---|
| 5,317,173 A | | 5/1994 | Sovero | 257/197 |
| 5,389,891 A | * | 2/1995 | Phillipe | 330/253 |
| 5,900,779 A | | 5/1999 | Giacomini | 330/252 |
| 6,069,523 A | * | 5/2000 | Brown | 330/260 X |

OTHER PUBLICATIONS

DeLisio, Michael P., et al., "Modeling and Performance of a 100–Element pHEMT Grid Amplifier," *IEEE Transactions on Microwave Theory and Techniques*, vol. 44, No. 12, pp. 2136–2144, Dec. 1996.
Kim, M., et al., "A 100–Element HBT Grid Amplifier," *IEEE Transactions on Microwave Theory and Techniques*, vol. 41, No. 10, pp. 1762–1771, Oct. 1993.
Kim, Moonil, et al., "A Grid Amplifier," *IEEE Microwave and Guided Wave Letters*, vol. 1, No. 11, p. 322, Nov. 1991.
Liu, C. M., et al., "A Millimeter–Wave Monolithic Grid Amplifier," *Int. Journal of Infrared and Millimeter Waves*, vol. 16, No. 11, Nov. 1995.

* cited by examiner

*Primary Examiner*—Steven J. Mottola
(74) *Attorney, Agent, or Firm*—Fish & Richardson P.C.

(57) ABSTRACT

The present invention discloses active unit cell topologies for quasi-optic grid array structures that make use of combinations of one of several broadband or frequency-selective positive (or regenerative) feedback networks, as well as multiple transistor configurations in order to enhance the gain of the grid array amplifier. These new topologies yield higher gain, extending the utility of the grid array amplifier to both new applications requiring higher gain, as well as to higher frequencies where the intrinsic gain of the active devices is lower. They also offer greater flexibility in impedance matching, improving the bandwidth and manufacturability of the design.

20 Claims, 7 Drawing Sheets

TECHNIQUES FOR ENHANCING GAIN IN A QUASI-OPTIC GRID ARRAY

CROSS-REFERENCE TO RELATED APPLICATIONS

This application claims the benefit of U.S. Provisional Application No. 60/211,252, filed on Jun. 13, 2000. +gi

STATEMENT AS TO FEDERALLY SPONSORED RESEARCH

The U.S. Government may have certain rights in this invention pursuant to ARO Grant No. DAA G55-98-1-0001 awarded by the U.S. Army.

BACKGROUND OF THE INVENTION

1. Field of the Invention

This invention relates to quasi-optic arrays, such as grid arrays, and, in particular to techniques for enhancing the gain and bandwidth of active unit cells that comprise such arrays.

2. Description of Related Art

Broadband communications, radar and other imaging systems require the transmission of radio frequency ("RF") signals in the microwave and millimeter wave bands. In order to efficiently achieve the levels of output transmission power needed for many applications at these high frequencies, a technique called "power combining" has been employed, whereby the output power of individual components are coupled, or combined, thereby creating a single power output that is greater than an individual component can supply. Conventionally, power combining has used resonant waveguide cavities or transmission-line feed networks. These approaches, however, have a number of shortcomings that become especially apparent at higher frequencies. First, conductor losses in the waveguide walls or transmission lines tend to increase with frequency, eventually limiting the combining efficiency. Second, these resonant waveguide cavities or transmission-line combiners become increasingly difficult to machine as the wavelength gets smaller. Third, in waveguide systems, each device often must be inserted and tuned manually. This is labor-intensive and only practical for a relatively small number of devices.

Several years ago, spatial power combining using "quasi-optics" was proposed as a potential solution to these problems. The theory was that an array of microwave or millimeter-wave solid state sources placed in a resonator could synchronize to the same frequency and phase, and their outputs would combine in free space, minimizing conductor losses. Furthermore, a planar array could be fabricated monolithically and at shorter wavelengths, thereby enabling potentially thousands of devices to be incorporated on a single wafer.

Since then, numerous quasi-optical devices have been developed, including detectors, multipliers, mixers, and phase shifters. These passive devices continue to be the subject of ongoing research. Over the past few years, however, active quasi-optical devices, namely oscillators and amplifiers, have evolved. One benefit of spatial power combining (over other methods) using quasi-optics is that the output power scales linearly with chip area. Thus, the field of active quasi-optics has attracted considerable attention in a short time, and the growth of the field has been explosive.

It is believed that the first quasi-optical grid array amplifier was a grid developed by M. Kim et al at the California Institute of Technology. This grid used 25 MESFET differential pairs, demonstrating a gain of 11 dB at 3 GHz. As shown in FIG. 1, a typical grid amplifier 10 is an array of closely-spaced differential pairs of transistors 14 on an active grid 12 sandwiched between an input and output polarizer, 18, 24. An input signal 16 passes through the horizontally polarized input polarizer 18 and creates an input beam incident from the left that excites rf currents on the horizontally polarized input antennas 20 of the grid 12. These currents drive the inputs of the transistor pair 14 in the differential mode. The output currents are redirected along the grid's vertically polarized antennas 22, producing a vertically polarized output beam 30 via an output polarizer 24 to the right.

The cross-polarized input and output affords two important advantages. First, it provides good input-output isolation, reducing the potential for spurious feedback oscillations. Second, the amplifier's input and output circuits can be independently tuned using metal-strip polarizers, which also confine the beam to the forward direction. Numerous grid amplifiers have since been developed and have proven thus far to have great promise for both military and commercial RF applications and particularly for high frequency, broadband systems that require significant output power levels (e.g.>5 watts) in a small, preferably monolithic, package. Moreover, a resonator can be used to provide feedback to couple the active devices to form a high power oscillator.

Unfortunately, conventional active grids arrays, such as amplifiers and oscillators have not been as efficient as is desirable. In particular, reported grid array amplifiers using simple differential pair unit cells exhibit only relatively limited gain, on the order of 10 dB or less. The limited gain limits the applications to which conventional grid arrays may be employed. Moreover, in addition to gain, frequency response and impedance matching are all critical criteria for the design of microwave and millimeter wave devices. The current state of quasi-optic amplifier design does not adequately address these issues.

There is thus a definite need for active quasi-optic grid arrays, and particularly the unit cells that comprise the arrays, that yield higher gains, at higher frequencies. It would be further desirable to have such components that offer greater flexibility in impedance matching, thereby improving the bandwidth and manufacturability of such designs.

SUMMARY OF THE INVENTION

The present invention, which addresses these needs, resides in an architecture for improving the gain and bandwidth of active quasi-optic grid array unit cells. A method of the invention includes providing a two active networks and applying reinforcing signals to each of the networks. The first active network is driven by an input signal of a given magnitude and polarity and the second active network is driven by an input signal that is equal and opposite to the input signal that drives the first network. The first network includes a signal input port, a signal output port, a feedback tie-in port and a feedback take-off port. Similarly, the second network includes a signal input port, a signal output port, a feedback tie-in port, and a feedback take-off port. The method then applies to the feedback tie-in port of the first active network, via a feedback path, a reinforcing signal derived from the feedback take-off port on one of the active networks of the unit cell, and applies to the feedback tie-in port of the second active network, via a feedback path, a reinforcing signal derived from the feedback take-off port on the other one of the active networks of the unit cell. Each of the feedback paths includes a substantially identical feedback network having a transfer function that causes the reinforcing signal applied to each network to add constructively to the input signal applied to that network within the frequency range of interest.

In one aspect of the invention, the reinforcing signal applied to the feedback tie-in port of the first network is derived from the feedback take-off port of the second network, and the reinforcing signal applied to the feedback tie-in port of the second network is derived from the feedback take-off port of the first network. This may be referred to as a cross-coupled, regenerative feedback topology.

In a specific implementation of this aspect, the feedback tie-in port of each network is internally connected to the signal input port of that network and the feedback take-off port of each network is internally connected to the signal output port of that network. This embodiment includes a simple differential pair of active device connected using a crossed-coupled, regenerative feedback topology.

In an alternative aspect of the invention, the reinforcing signal applied to the feedback tie-in port of the first network is derived from the feedback take-off port of the first network and the reinforcing signal applied to the feedback tie-in port of the second network is derived from the feedback take-off port of the second network (broad shunt—shunt config.) In this embodiment, the feedback path of each network includes a substantially identical feedback network and the reinforcing signal applied to the feedback tie-in port is derived via a combination of a frequency dependent phase shift from the active network and an additional frequency dependent phase shift from the feedback network. In a more detailed aspect of this "shunt—shunt" configuration, the feedback tie-in port of each network is internally connected to the signal input port of that network, and the feedback take-off port of each network is internally connected to the signal output port of that network.

The present invention also discloses a differential unit cell for a quasi-optic grid array. The cell comprises first and second active networks and first and second reinforcing signal paths. Each network has a signal input port, an amplification stage, a signal output port, a feedback take-off port, a feedback tie-in port and a reference port. The networks are connected to each other via the respective reference ports.

In one embodiment, the first reinforcing signal path connects the feedback tie-in port of the first network with the feedback take-off port of the second network, and the second reinforcing signal path connects the feedback tie-in port of the second network with the feedback take-off port of the first network. Each of the two reinforcing signal paths includes a feedback network. In a more detailed aspect of this embodiment, the first active network includes a second amplification stage connected to the first amplification stage via a coupling impedance network and the second active network includes a second amplification stage connected to the first amplification stage via a coupling impedance network. In another embodiment of this differential unit cell, the first reinforcing signal path connects the feedback tie-in port of the first network with the feedback take-off port of the first network, and the second reinforcing signal path connects the feedback tie-in port of the second network with the feedback take-off port of the second network. Each of the two reinforcing signal paths includes a feedback network. In a more detailed aspect of this embodiment of the differential unit cell, the first active network includes a second amplification stage connected to the first amplification stage via a coupling impedance network and the second active network includes a second amplification stage connected to the first amplification stage via a coupling impedance network.

The present invention also discloses yet an even more detailed description of the differential unit cell for a quasi-optic grid array. In this embodiment, the cell has a first input port for an input signal, a second input port for an input signal that is equal and opposite to the input signal at the first input port, a first output port and a second output port. The cell also includes a first three-terminal active device having a control electrode connected to the first input port, an anode connected to the first output port and a cathode and a second three-terminal active device having a control electrode connected to the second input port, an anode connected to the second output port and a cathode connected to the cathode of the first active device in a differential pair configuration. In this single differential pair embodiment, the anode of the first active device is connected to the control electrode of the second active device through a first regenerative feedback network and the anode of the second active device is connected to the control electrode of the first active device through a second regenerative feedback network. This may be referred to as a cross-coupled regenerative feedback differential pair cell.

In yet an another differential pair design with positive feedback., disclosed is a unit cell for a quasi-optic grid array having a first input port for an input signal and a second input port for an input signal that is equal and opposite to the input signal at the first input port, a first output port and a second output port. The cell also includes a first three-terminal active device having a control electrode control connected to the first input port, an anode connected to the first output port and a cathode and a second three-terminal active device having a control electrode control connected to the second input port, an anode connected to the second output port and a cathode connected to the cathode of the first active device. The three terminal device can be any kind of active device, such as a FET or BJT. The anode of the first active device is connected to the control electrode of the first active device through a first regenerative feedback network in a differential pair configuration, and the anode of the second active device is connected to the control electrode of the second active device through a second regenerative feedback network. This may be referred to as a shunt—shunt, regenerative feedback differential pair cell.

Both networks in the unit cell may also include multiple amplification stages to further improve performance. In particular, the first active network may have an input port, an output port and a reference port, and at least a first and second amplification stage. In turn, each stage includes at least one three-terminal active device having a cathode, an anode and a control electrode. Similarly, the second active network, which is substantially identical to the first network, may have an input port, an output port and a reference port, and at least a first and second amplification stage. Each stage of this network also includes at least one three-terminal active device having a cathode, an anode and a control electrode. The second network is differently coupled to the first network via their respective reference ports. (multi-transistor per cell).

This multi-amplification per cell embodiment may be connected in several ways. In one design within the first network, the control electrode of the active device of the first amplification stage is connected to the input port of the network, the anode of the active device of the second amplification stage is connected to the output port of the network and the anode of the active device of the first amplification stage is connected to the control electrode of the active device of the second amplification stage through a coupling impedance network.

Alternatively, within the first network, the control electrode of the first active device is connected to the input port, the cathode of the first active device is connected to the reference port, and the anode of the first device coupled to the cathode of the second device through an impedance network, the control terminal of the second device is connected to a bias voltage through an impedance network, and the anode of the second device is connected to the output port.

As discussed in detail, cell designs that incorporate multiple stages of amplification per network may preferably be designed into the positive feedback implementations disclosed by the present invention. Two such combinations are explicitly disclosed.

In one of the combinations, the unit cell for a quasi-optic grid array comprises a first active network, a second active network, a first reinforcing signal path, and a second reinforcing signal path. The first active network includes a first signal input port for receiving an input signal, a first signal output port, a first feedback take-off port and a first feedback tie-in port. The first network further includes a first three-terminal active device having a control electrode connected to the signal input port, an anode and a cathode, and a second three-terminal active device having a control electrode internally connected to the anode of the first active device via a coupling impedance network, an anode connected to the signal output port, and a cathode connected to the cathode of the first active device.

The second active network includes a second signal input port for receiving an input signal that is equal and opposite to the first input signal, a second signal output port, a second feedback take-off port and a second feedback tie-in port. The second network further includes a third three-terminal active device having a control electrode connected to the second signal input port, an anode and a cathode, and a fourth three-terminal active device having a control electrode internally connected to the anode of the third active device via a coupling impedance network, an anode connected to the second signal output port, and a cathode connected to the cathodes of the first, second and third active devices.

In this design, the first reinforcing signal path connects the second feedback take-off port to the first feedback tie-in port via a first feedback network; and the second reinforcing signal path connects the first feedback take-off port to the second feedback tie-in port via a second feedback network. Moreover, the first feedback take-off port is internally connected to the anode of the first active device, the first feedback tie-in port is internally connected to the control electrode of the first active device, the second feedback take-off port is internally connected to the anode of the second active device, and the second feedback tie-in port is internally connected to the control electrode of the second active device. In other words, the cell comprises two substantially identical two-stage cascade networks differentially connected in a cross-coupled topology.

In another detailed combination, the unit cell for a quasi-optic grid array includes a first active network, a second active network, a first reinforcing signal path, and a second reinforcing signal path. The first active network includes a first signal input port for receiving an input signal, a first signal output port, a first feedback takeoff port and a first feedback tie-in port. It further includes a first three-terminal active device having a control electrode connected to the signal input port, an anode and a cathode, and a second three-terminal active device having a control electrode internally connected to the anode of the first active device via a coupling impedance network, an anode connected to the signal output port, and a cathode connected to the cathode of the first active device.

The second active network includes a second signal input port for receiving an input signal that is equal and opposite to the first input signal, a second signal output port, a second feedback take-off port and a second feedback tie-in port. This second network further includes a third three-terminal active device having a control electrode connected to the second signal input port, an anode and a cathode, and a fourth three-terminal active device having a control electrode internally connected to the anode of the third active device via a coupling impedance network, an anode connected to the second signal output port, and a cathode connected to the cathodes of the first, second and third active devices.

The first reinforcing signal path connects the first feedback take-off port to the first feedback tie-in port via a first feedback network, and the second reinforcing signal path connects the second feedback take-off port to the second feedback tie-in port via a second feedback network. In this specific design, the first feedback takeoff port is internally connected to the anode of the second active device, the first feedback tie-in port is internally connected to the anode of the first active device, the second feedback take-off port is internally connected to the anode of the fourth active device, and the second feedback tie-in port is internally connected to the anode of the third active device. In other words, the cell comprises two substantially identical two-stage cascade networks differentially connected in a shunt—shunt topology.

DETAILED DESCRIPTION OF THE PREFERRED EMBODIMENTS

The unit cell topologies disclosed herein employ three terminal amplifying devices such as FET's or BJT's and preferably high-speed transistors such as pBEMT's or HBT's. However, it should be understood that these topologies are applicable to any three-terminal amplifying device. In order to extend the discussion to a more general class of three-terminal devices, we shall refer to the two terminals between which the primary device current flows as the anode and the cathode, corresponding to the drain and source of a FET (e.g. pHEMT), respectively, and to the collector and emitter of a BJT (e.g. HBT), respectively. In normal operation, the anode is placed at a more positive potential than the cathode, with current flowing into the anode from the surrounding circuit, and flowing out of the cathode. The third electrical terminal of the device shall be referred to as the control electrode, corresponding to the gate of the FET (pHEMT) and base of the BJT (HBT). The voltage difference between the control electrode and the cathode (e.g. $V_{gs}$ in a FET) controls the current flow between the anode and cathode. In typical operation, the magnitude of the current flow into the control electrode is significantly smaller than the current flow between the anode and cathode.

The improvements over the previously described differential pair architecture used in grid array amplifiers can be divided into two categories, namely, (1) the addition of broadband or frequency-selective positive (or regenerative) feedback; and (2) the use of various differential amplifier configurations. In the preferred embodiments of the present invention, the gain enhancement techniques of both categories may be combined to create unit cell designs with even greater gains and efficiencies than any of the techniques could provide alone.

Figure 1:
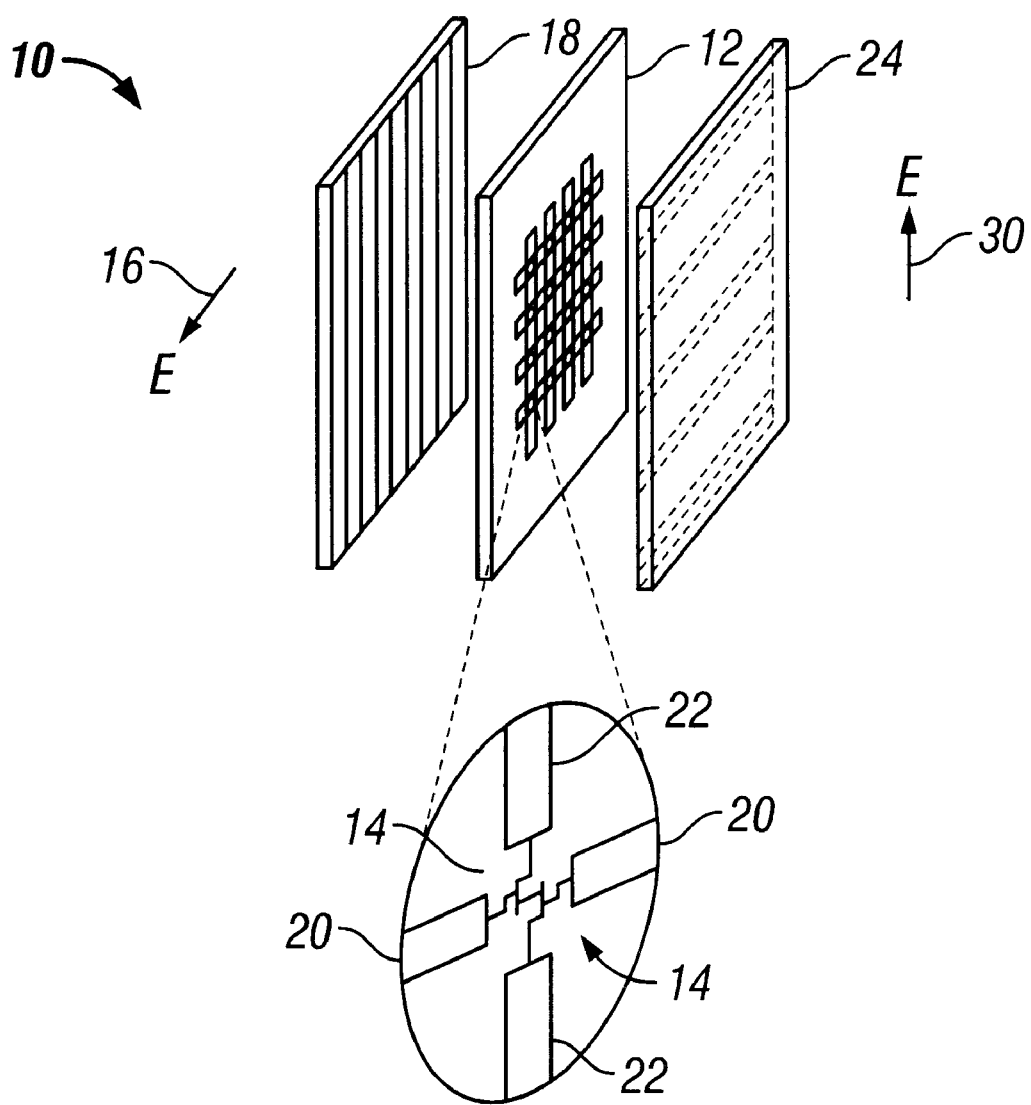
FIG. 1 is an exploded view of a conventional quasi-optic grid array with one of the differential pair unit cells in the array magnified.
Figure 2:
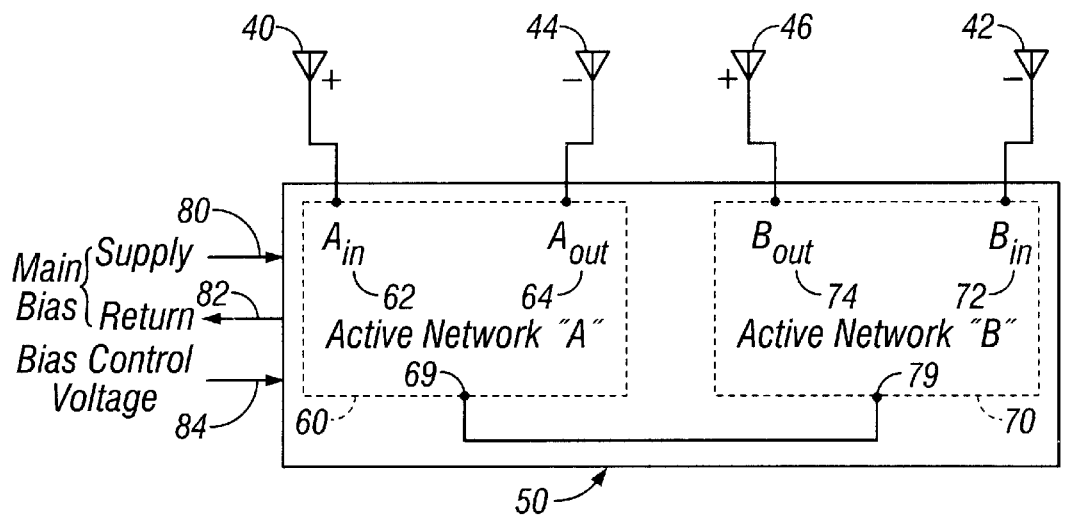
FIG. 2 is a block diagram of a conventional differential unit cell.
Figure 3:
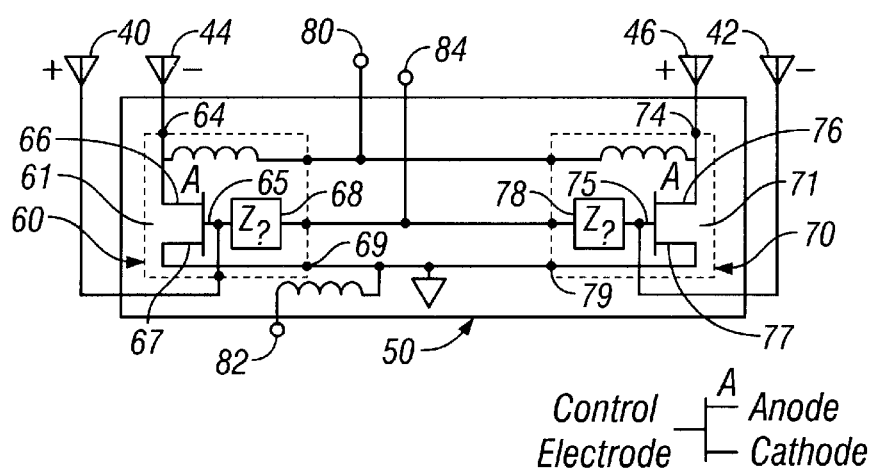
FIG. 3 is a schematic of the conventional differential unit cell shown in FIG. 2.

For the purpose of more clearly illustrating the inventive aspects of the present invention, FIG. 2 shows a system-level representation, and FIG. 3 shows a circuit level schematic of a conventional differential amplifier unit cell employed in typical grid array amplifiers, such as the magnified unit cell shown in FIG. 1. The convention used in these figures and in the remaining figures that depict the improved differential cells of the present invention is that each half of a unit cell that contains at least one active device is called an "active network" and is denoted by dotted lines. A complete unit cell is denoted by a solid box.

Referring to FIGS. 2 and 3, the conventional unit cell 50 includes two active networks 60 and 70 (referred to in FIG. 2 as "Active Network" "A" and "Active Network""B", respectively) that are differentially interconnected via reference ports 69 and 79. As in all of the embodiments of the present invention described in detail below, these two active networks are preferably, but not necessarily substantially identical to each other. By "substantially identical" it is understood that the two networks have substantially identical electrical behavior. An input signal (x-positive polarity) is received via input radiating structure 40 and (x-negative polarity) input radiating structure 42, which can be leads, antennas or other suitable structures, and into the input (positive) port $A_{in}$ 62 and input (negative) port Bin 72 of the respective networks. That is, the signal at input port $B_{in}$ 72 is equal of magnitude and opposite polarity to the input signal at input port $A_{in}$ 62. The output signal is radiated into free space via output radiating structures 44, 46 from signal output port $A_{out}$ 64 of the first network 60 (y-negative polarization) and signal output port $B_{out}$ 74 of the second network 70 (y-positive polarization), respectively. The networks are biased via a main bias supply at 80, a main bias return at 82 and a control voltage bias at 84.

Taking a closer look at the networks on a schematic level, FIG. 3 shows that the first network 60 contains a three terminal active device 61 having a control electrode 65 an anode 66, and a cathode 67. Correspondingly, the second network 70 includes another three-terminal active device 71 having a control electrode 75 an anode 76, and a cathode 77. The control electrodes 65, 75 are connected to each other via impedance network $Z_b$ 68 in the first active network and impedance network $Z_b$ 78 in the second active network, the cathodes 67, 77 are connected to each other through reference ports 69, 79, the anode 66 of the first device is connected to the signal output port $A_{out}$ 64 and the anode 76 of the second device 71 in the second network 70 to signal output port $B_{out}$ 74.

Regenerative Gain In Unit Cell

Figure 4:
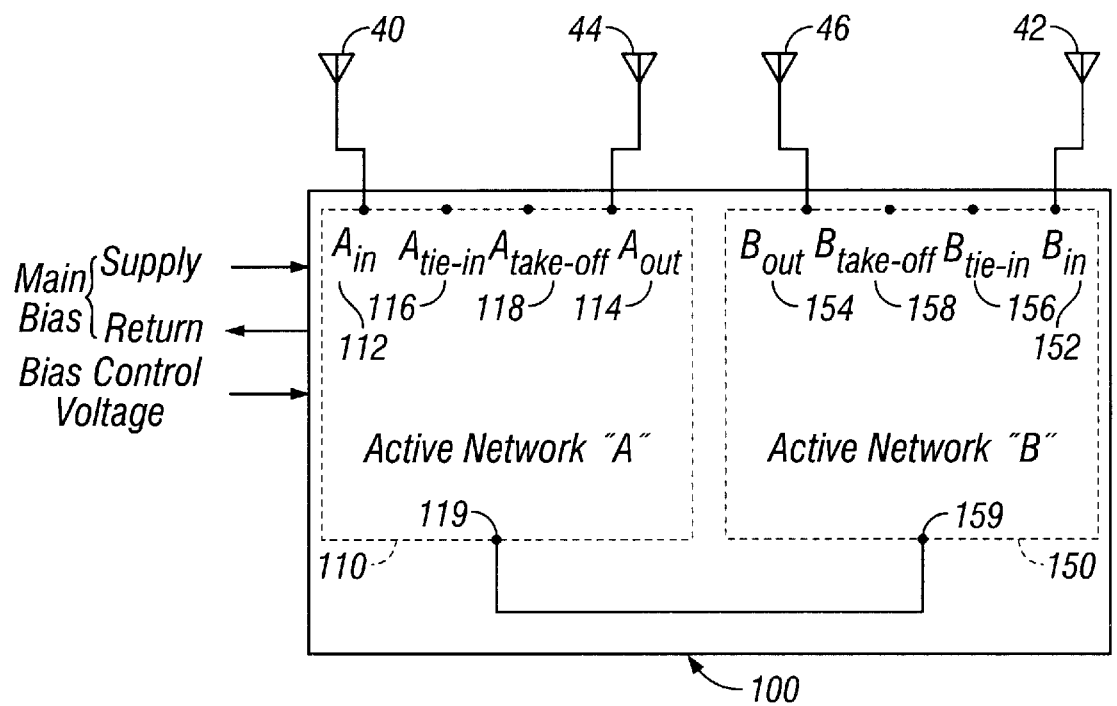
FIG. 4 is a block diagram of a two network unit cell displaying the port convention used in connection with the description of the present invention.

The feedback employed in connection with the improved cells of the present invention is positive feedback that provides regenerative gain to the signal input to the unit cell. FIG. 4 is a block diagram that sets up the convention used to describe the general class of regenerative gain circuits of the present invention. In particular, unit cell 100 includes two active networks, Network "A" 110 and Network "B" 150. Network "A" 110 includes an input port 112 connected to the input radiating structure 40, an output port 114 connected to the output radiating structure 44, a feedback tie-in port 116 and a feedback take-off port 118. Similarly, Network "B" 150 includes an input port 152 connected to the input radiating structure 42, an output port 154 connected to the output radiating structure 46, a feedback tie-in port 156 and a feedback take-off port 158. Reference ports 119 and 159 are connected together. In this general case, each of the take-off and tie-in ports of each network may be connected to one of the other ports on either of the networks to obtain a positive gain.

Figure 5:
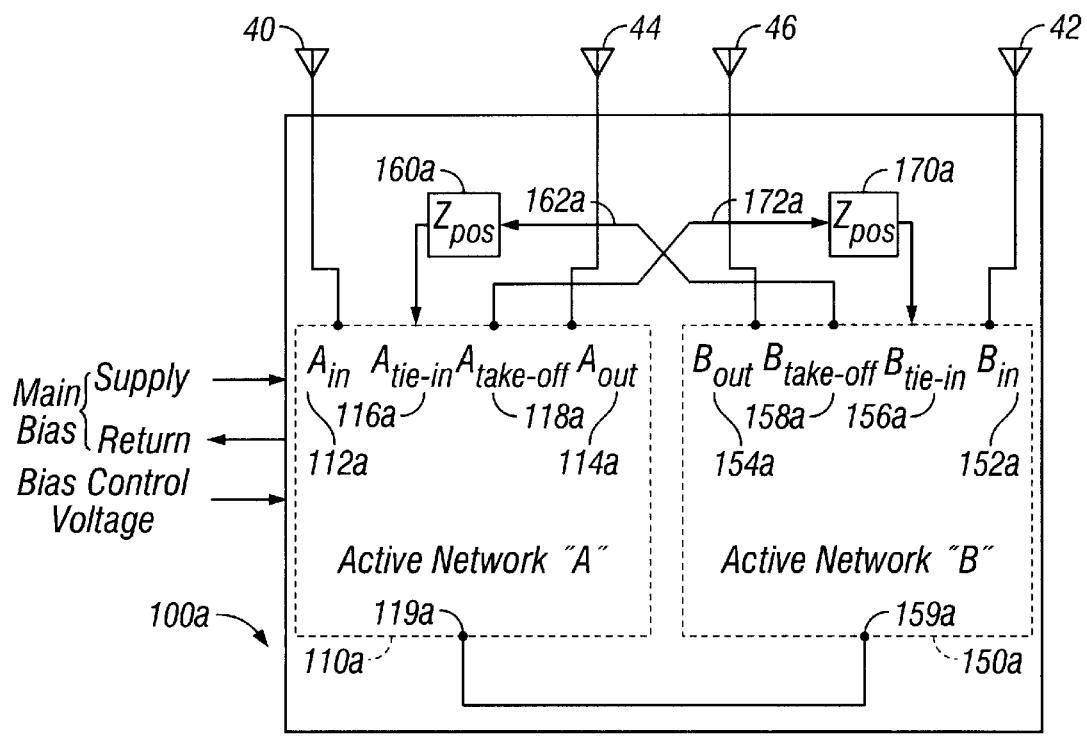
FIG. 5 is a block diagram of one embodiment of the present invention, wherein a cross-coupled regenerative feedback topology is designed into a differential unit cell having two active networks.
Figure 6:
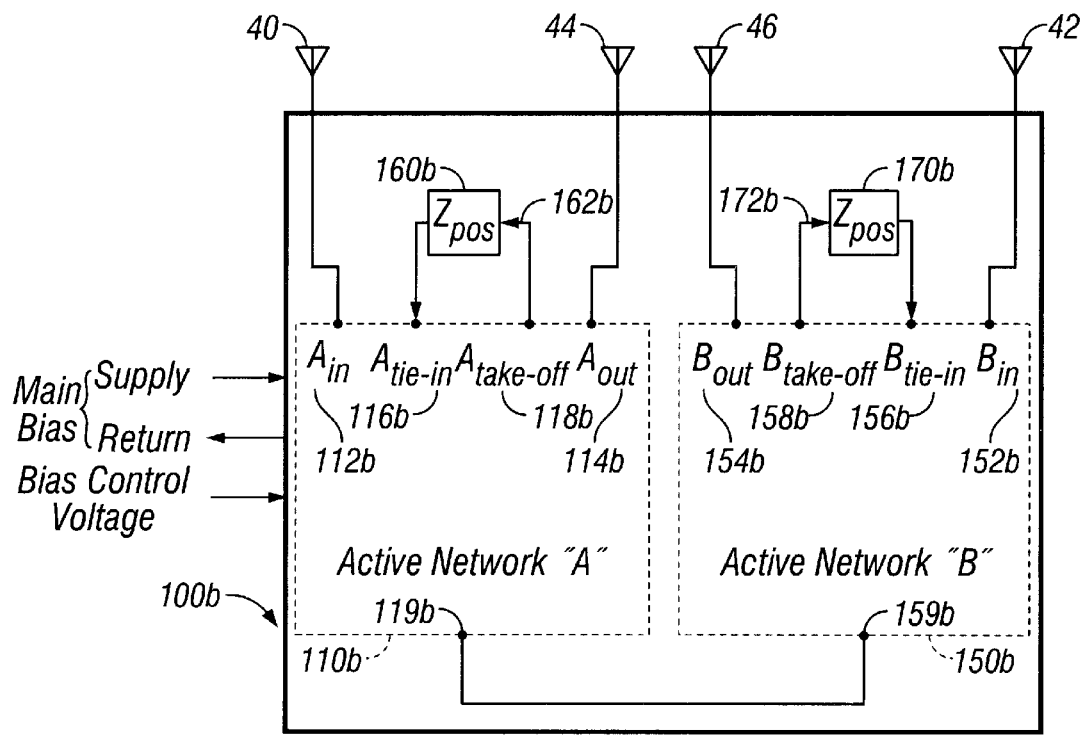
FIG. 6 is a block diagram of a second embodiment of the present invention, wherein a shunt—shunt regenerative feedback topology is designed into a differential unit cell having two active networks.

As will be seen, feedback elements, or positive feedback networks, labeled $Z_{pos}$, are introduced in each of the feedback lines of the present invention. As will be understood by those skilled in the art, the passive components (i.e., resistors, capacitors, and inductors) that comprise the feedback elements are chosen such that the phase of the feedback element transfer function causes the feedback signal (i.e., the output of the feedback element) to add constructively to the input signal within the frequency range of interest for amplification. This positive feedback both enhances gain and can modify the effective input and output impedances to improve the port impedance matching. It should be understood that the feedback element transfer function can also be chosen to simultaneously provide negative feedback outside the frequency range of interest to improve amplifier stability. FIGS. 5 and 6 show two specific topologies of this regenerative, or positive, feedback model for the unit cell shown in FIG. 4.

1. Cross-Coupled Broadband Regenerative Feedback

Turning to FIG. 5, a block diagram of one regenerative feedback topology for a unit cell is disclosed. As noted in the block diagram, a reinforcing signal for the first active network 110a is taken from feedback take-off port 158a of the second network 150a via a positive feedback network 160a along feedback line 162a and into feedback tie-in port 116a of the first network. Similarly, a reinforcing signal for the second active network 150a is taken from feedback take-off port 118a of the first network 110a via a positive feedback network 170a along feedback line 172a and into feedback tie-in port 156a of the second network. The topology is called a "cross-coupled feedback unit cell." This general topology applies regardless of the structure, and particularly the number of amplification stages, that is inside the active network. The "cross-coupled" topology can provide broadband regenerative feedback, and thereby enhance gain and impedance matching over a wide frequency range. This technique is most useful when the operation frequency for the grid array is substantially below $f_{max}$, the unity power gain frequency of the active devices used in the array, where the excess phase shift contributed by the active devices is relatively small. The broadband feedback networks, $Z_f$, can be as simple as a resistive voltage divider between each output, the corresponding polarity input, and signal ground (the cell center), with a DC blocking capacitor between the output and input to maintain DC bias levels.

2. Shunt—Shunt Narrowband Regenerative Feedback

FIG. 6 shows a block diagram of a second positive feedback scheme using the convention established in FIG. 4. In particular, unit cell 100b comprises a first active network 110b and a second active network 150b interconnected via their respective reference ports 199b, 159b. A reinforcing signal for the first active network 110b is taken from feedback take-off port 118b of the first network 110b via a positive feedback network 160b along feedback line 162b and into feedback tie-in port 116b of the first network. Similarly, a reinforcing signal for the second active network 150b is taken from feedback take-off port 158b of the second network 150b via a positive feedback network 170b along feedback line 172b and into feedback tie-in port 156b of the second network. In this sense, each active network is self-reinforcing.

This topology creates "shunt—shunt regenerative feedback unit cells" and applies to a category of circuits, irrespective of the number of amplification stages (active devices, such as transistors) that are inside the active networks and how the stages are interconnected. At DC, this scheme provides negative (non-reinforcing) feedback. However, accounting for the intrinsic phase shift of the active devices plus the phase shift contributed by the feedback networks, the feedback is actually positive in the frequency band of interest. Obtaining this introduced phase shift typically involves the use of reactive or delay elements in the feedback path. This technique is particularly useful when the frequency of operation of the grid array is relatively close to the $f_{max}$ of the active devices whereat the excess phase shift contributed by the active devices make the broadband (cross-coupled) approach of described above more difficult to implement. While prior grid arrays have implemented shunt—shunt feedback, it has always been used as relatively broadband negative feedback intended to stabilize the unit cell amplifier against oscillations. Note that since the feedback network disclosed here is frequency-selective (rather than broadband), it can be used both to provide positive feedback at the intended operation frequency (enhancing gain and/or improving impedance matching), and negative feedback at other frequencies (stabilizing the grid array against unwanted oscillations).

3. Simple Differential Pair Implementations

Figure 7:
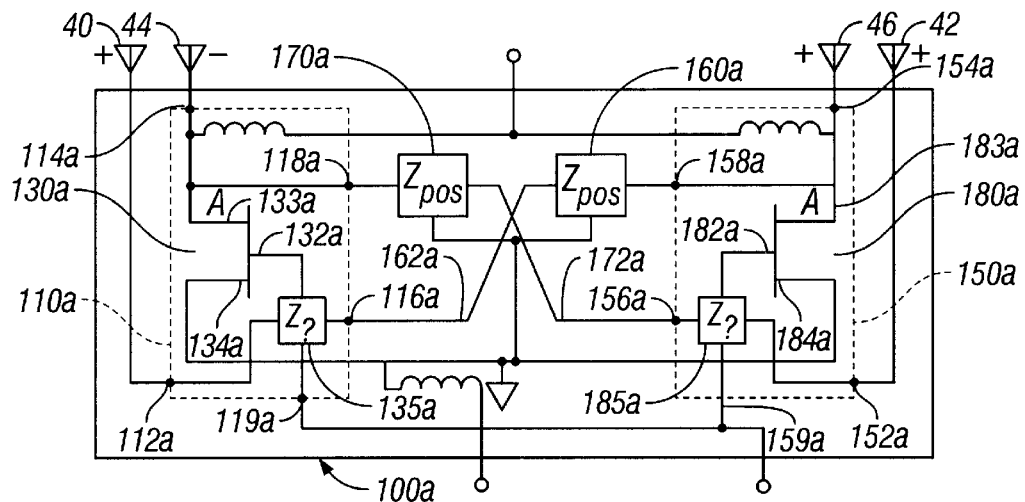
FIG. 7 is a circuit schematic of a unit cell of the present invention that implements the unit cell topology shown in FIG. 5, wherein each active network includes one active device.

One particular implementation of the cross-coupled topology shown in FIG. 5 is the simple case wherein each active network comprises a single three-terminal active device (e.g. transistor). This is shown schematically in FIG. 7, wherein all elements and corresponding references numerals outside of, and at the ports of the two active networks are the same as shown and described in the general case shown in FIG. 5. Inside the first active network 10a is a three terminal active device 130a having a control electrode 132a, an anode 133a and a cathode 134a. The input port 112a is connected to control electrode 132a via a biasing network $Z_b$, 135a and the output port 114a is connected to the anode 133a. Turning to the second active network 150a, a three terminal active device 180a having a control electrode 182a, an anode 183a and a cathode 184a is shown. The input port 152a is connected to control electrode 182a via a biasing network $Z_b$, 185a and the output port 154a is connected to the anode 183a.

The cross-coupled feedback paths are connected as follows. Feedback into the First Network 110a: The feedback take-off port 158a of the second network is connected to the output port 154a (and anode 183a) of the second network and provides a reinforcing signal, via feedback network 160a on path 162a to the feedback tie-in port 116a of the first network 110a. As seen this port 116a is connected with input port 112a, via $Z_b$, 135a, and tied into control electrode 132a. Feedback into the Second Network 150a: The feedback take-off port 118a of the first network is connected to the output port 114a (and anode 133a) of the first network and provides a reinforcing signal, via feedback network 170a on path 172a to the feedback tie-in port 156a of the second network 150a. As seen, this tie-in port 156a is connected to input port 152a, via $Z_h$, 185a, and tied into control electrode 182a of the active device 180a.

Figure 8:
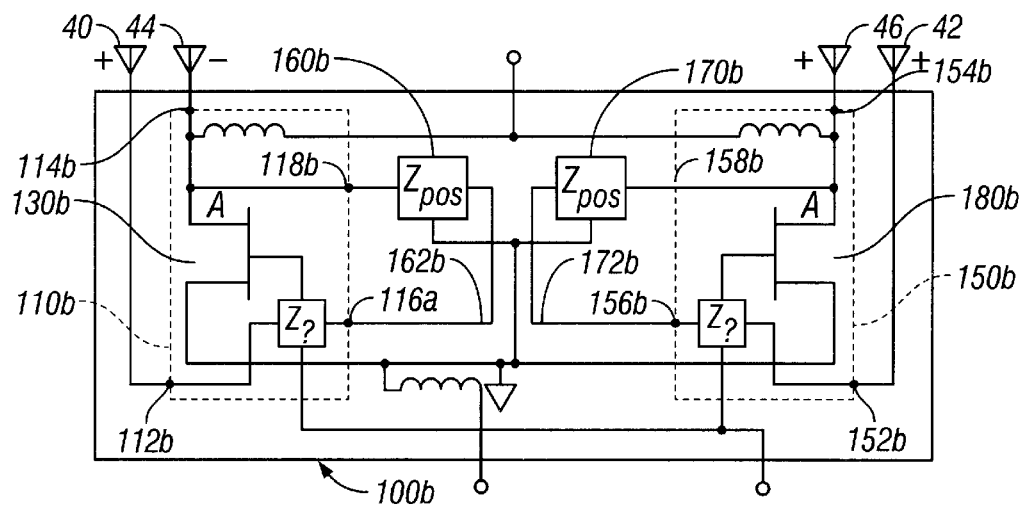
FIG. 8 is a circuit schematic of a unit cell of the present invention that implements the unit cell topology shown in FIG. 6, wherein each active network includes one active device.

FIG. 8 shows an implementation of the shunt—shunt topology shown in FIG. 6 for a unit cell 100b wherein each network 110b and 150b comprises a single three-terminal active device (e.g. transistor) having a control electrode, anode and cathode. Turning to the first active network 110b, as in the prior case, the input port 112b is connected to control electrode via a biasing network $Z_b$ and the output port 114b is connected to the anode.

The shunt—shunt feedback path for the first network is now described. The feedback take-off port 118b is connected to the output port 114b (and anode) and provides a reinforcing signal, via feedback network 160b on path 162b to the feedback tie-in port 116b of the network. As seen, this port 116b is connected to the input port 112b, via $Z_b$ and tied into control electrode of the active device 110b. As seen from FIG. 8, the identical feedback pattern and network is applied to the second active network 150b of the unit cell 100b.

Multiple Active Devices in Each Half Unit Cell

Figure 9:
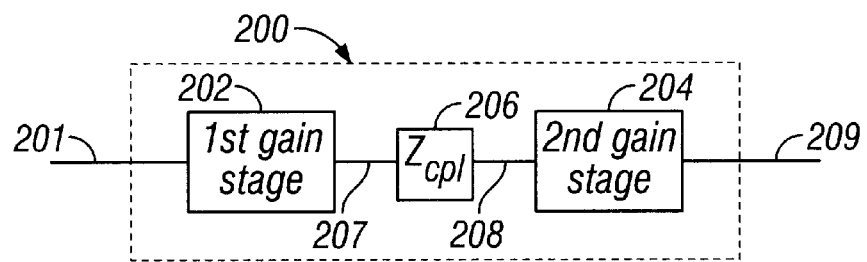
FIG. 9 is a block diagram of a general case for a half unit cell that includes two stages of amplification.
Figure 10:
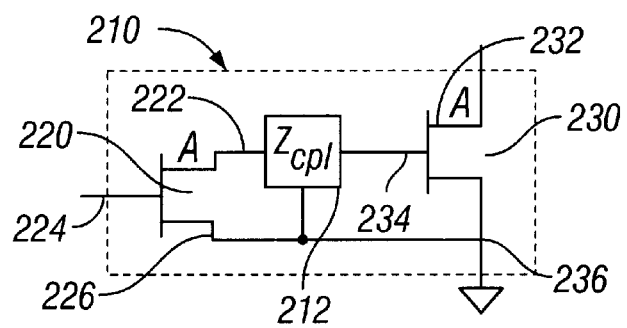
FIG. 10 illustrates one preferred configuration of the half unit cell shown in FIG. 9, wherein the two active device are cascaded together.
Figure 11:
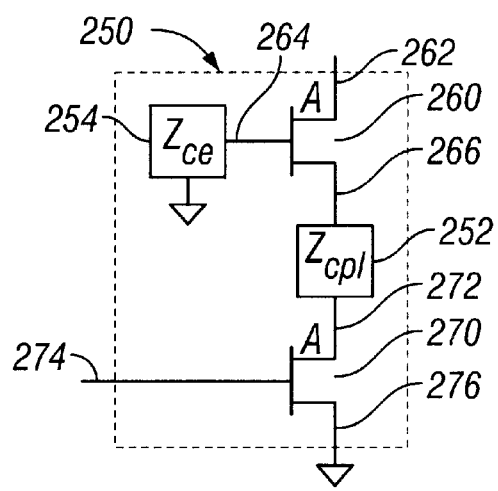
FIG. 11 illustrates another preferred configuration of the half unit cell shown in FIG. 9, wherein the two active devices are cascoded together.

FIGS. 9, 10 and 11 illustrate preferred inventive configurations in which each half of a unit cell differential amplifier incorporates multiple active devices in order to further enhance the gain of the unit cells. This is contrasted with the conventional grid array amplifier shown in FIGS. 1 and 2 in which a simple differential pair is used.

Referring to the general case, shown in FIG. 9 is a half unit cell 200 having a first amplification or gain, stage 202 that received an input signal 201 and that coupled to a second amplification, or gain, stage 204 via a coupling impedance network 206, which produces at output 209 an amplified signal that is basically the product of the two stages of gain. As will be seen, when multi-stage amplification is applied to the feedback designs described above, the interstage coupling ports 207, 208 will be used.

One specific implementation of multi-stage amplification in a half unit cell is shown on a transistor level in FIG. 10 wherein one amplification stage is cascaded to the next. In particular, the half cell 210 includes a first active device 220 that receives the input signal at its control electrode 224 and having an anode 222 that is coupled (at signal frequencies) to the control electrode 234 of the second device 230 through a coupling impedance network 212, which may be chosen to have a frequency-dependent transfer function. There can be substantial gain enhancement realized using this configuration, since the overall gain is essentially the product of the gains realized by each of the active devices taken separately. There can also be a significant improvement in impedance matching, since the geometry of the first or input device of the pair can be tailored to improve the matching—specifically, for example, one can make the input device smaller (lower current-carrying capability) to provide a higher input impedance, while keeping the second device (which must carry enough current to generate significant output power) large. The required biasing is not explicitly shown in 10, but it will be well understood in the art that the details of the bias configuration will depend on the nature of the active device used.

FIG. 11 illustrates another preferred configuration in which each half of the unit cell differential amplifier incorporates two active devices. In this configuration, the anode 272 of the first device 270 is coupled to the cathode 266 of the second device 260, while the control electrode 264 of the second device is coupled through a specified impedance 254 to the signal ground (the cell center). The input from an input radiating structure is applied to the control electrode 274 of the first device and the anode 262 of the first device is connected to an output radiating structure. This configuration also can allow significant gain enhancement to be realized relative to that provided by a single active device. Biasing is not explicitly shown, but will be required. The details of the bias configuration will depend on the nature of the active device used.

It should be understood that the techniques described herein for coupling multiple active devices within in each half of a unit cell is not limited to two active devices per half-cell. More that two devices may be cascaded or cascoded in manners similar to those shown in FIGS. 10 and 11 in order to enhance the gain, frequency response or impedance matching performance of differential unit cell even more than the dual-transistor designs described in detail herein.

Regenerative Feedback/Multiple Amplification Stages in Each Half Unit Cell

The present invention also discloses a device and method for combining the feedback techniques described above with the multi-transistor differential unit cells described in order to achieve even greater performance. For example, the cross-coupled regenerative feedback network described in conjunction with FIGS. 5 and 7 can be incorporated with the multi-stage half unit cells of the type shown in FIG. 10.

Figure 12:
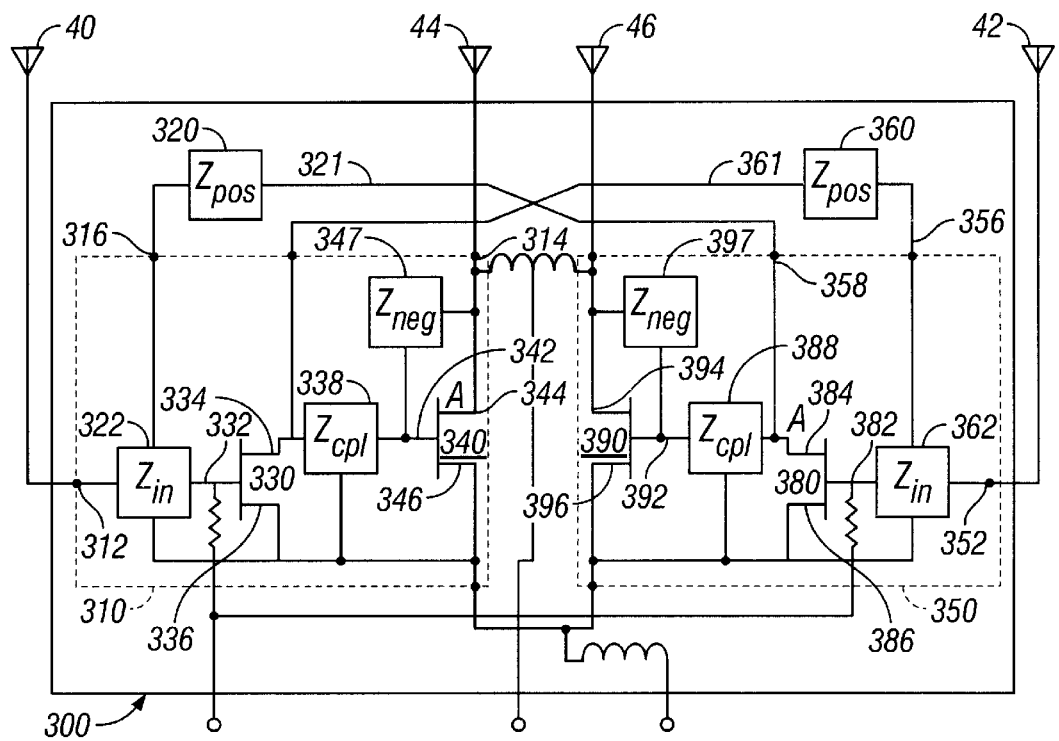
FIG. 12 is a schematic of one implementation of a unit cell of the present invention, wherein each active network designed as a cascade half unit cell with the networks employing cross-coupled regenerative feedback.

In particular, FIG. 12 shows a differential unit cell 300 of the having a first cascaded two-stage active network 310 and a second cascaded two-stage active network 350, interconnected with the cross-coupled regenerative feedback technique described above with respect to FIG. 5. The first active network includes the four signal ports described in FIG. 5, namely a signal input port 312 connected to the input radiating structure 40 (positive polarity), a signal output port 314 connected to an output radiating structure 44, a feedback tie-in port 316 and a feedback take-off port 318. Similarly, the second active network 350 includes a signal input port 352 connected to an input radiating structure 42 (negative polarity), a signal output port 354 connected to an output radiating structure 46, a feedback tie-in port 356 and a feedback take-off port 358.

The first network includes a first three-terminal active device 330, having a control electrode 332, an anode 334 and an cathode 336, and a second three terminal active device 340, having a control electrode 342, an anode, 344 and a cathode 346. The anode 334 of the first device is connected to the control electrode 342 of the second device via a coupling network $Z_{cpl}$ 338. The second network similarly includes a first three-terminal active device 380, having a control electrode 382, an anode 384 and an cathode 386, and a second three terminal active device 390, having a control electrode 392, an anode, 394 and a cathode 396. The anode 384 of the first device is connected to the control electrode 392 of the second device via a coupling network $Z_{cpl}$ 388.

The regenerative gain feedback for the circuit operates as follows: The feedback take-off port 358 of the second network 350 is connected to the anode 384 of the first device of the second network and acts as an inter-stage coupling port. This feedback signal travels on the first feedback path 321 through feedback port $Z_{pos}$ 320 and into feedback tie-in port 316 and combines with the input signal 40 at $Z_{in}$ 322 and into the control electrode 332 of the first stage 330 of the first network.

The regenerative gain for the second network employs a complementary scheme to the first network. The feedback take-off port 318 of the first network 350 is connected to the anode 334 of the first device of the first network and acts as an inter-stage coupling port. This feedback signal travels on the second feedback path 361 through feedback port $Z_{pos}$ 360 and into feedback tie-in port 356 and combines with the input signal 42 at $Z_{in}$ 362 and into the control electrode 382 of the first stage 380 of the second network.

Figure 13:
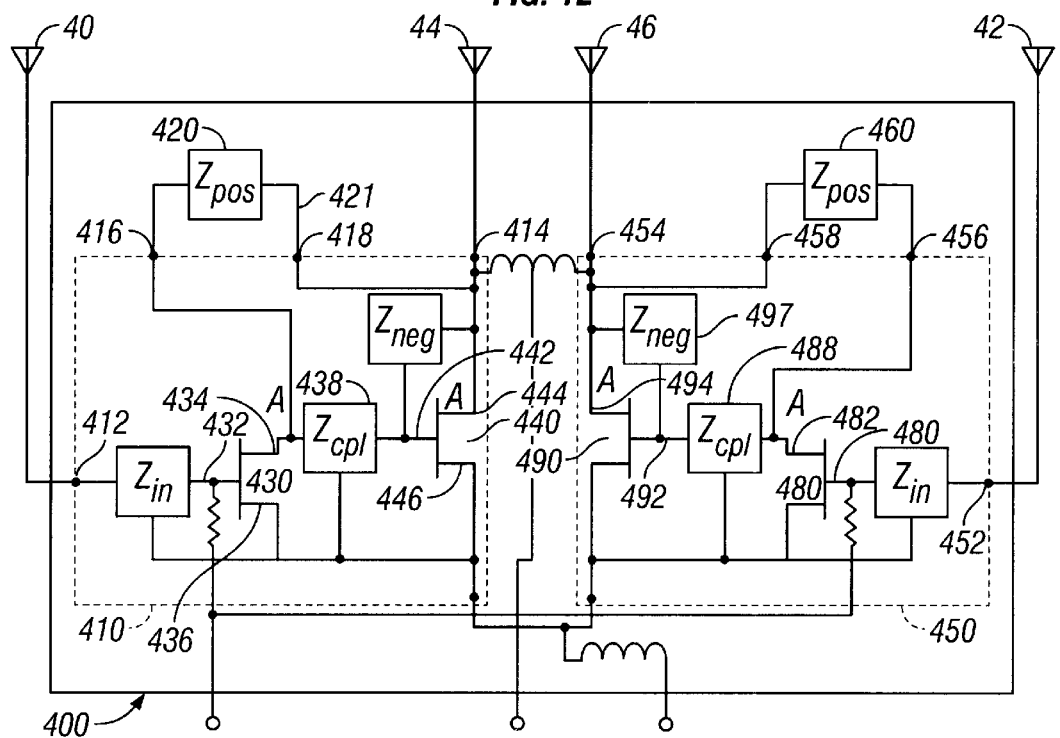
FIG. 13 is a schematic of another implementation of a unit cell of the present invention, wherein each active network designed as a cascade half unit cell with the networks employing shunt—shunt regenerative feedback.

As an alternative to FIG. 12, the shunt—shunt regenerative feedback network described in conjunction with FIGS. 6 and 8 can be incorporated with the multi-stage cascaded half unit cells of the type shown in FIG. 10. FIG. 13 shows such a unit cell 400. In particular, the first active network 410 includes the four signal ports described in FIG. 5, namely a signal input port 412 connected to the input radiating structure 40 (positive polarity), a signal output port 414 connected to an output radiating structure 44, a feedback tie-in port 416 and a feedback take-off port 418. Similarly, the second active network 450 includes a signal input port 452 connected to an input radiating structure 42 (negative polarity), a signal output port 454 connected to an output radiating structure 46, a feedback tie-in port 456 and a feedback take-off port 458.

The first network 410 includes a first three-terminal active device 430, having a control electrode 432, an anode 434 and an cathode 436, and a second three terminal active device 440, having a control electrode 442, an anode, 444 and a cathode 446. The anode 434 of the first device is connected to the control electrode 442 of the second device via a coupling network $Z_{cpl}$ 438. Further, the signal output port 414 is connected to the anode of the second device 444. The second network similarly includes a first three-terminal active device 480, having an anode connected to the control electrode 492 of the second device via a coupling network $Z_{cpl}$ 488.

The regenerative gain feedback for the first network is designed as follows: The feedback take-off port 418 is connected to the anode 444 of the second device, which, as was pointed out, is connected to the output signal port 414. This feedback signal travels on the feedback path 421 through feedback port $Z_{pos}$ 420 and into feedback tie-in port 416 of the network and back into the control electrode 434 of the first device 430. The regenerative gain design for the second network 450 employs the same circuit.

This results in an increase in the input impedance of the amplifier input (which is beneficial for typical devices) and an improvement in the matching between the first and second stage transistors.

Having thus described exemplary embodiments of the invention, it will be apparent that further alterations, modifications, and improvements will also occur to those skilled in the art. Further, it will be apparent that the present technique and system is not limited to use as a technique for enhancing the gain of a grid amplifier using the combinations of circuit described herein. Rather, numerous other combinations will be readily apparent to those skilled in the art. For example, just as the multi-transistor cascade half cell design was designed into the two regenerative feedback topologies of the present invention, the cascode technique described in conjunction with FIG. 11 above may also readily be combined with the either of the feedback designs detailed herein (or others). Accordingly, the invention is defined only by the following claims.

We claim:

1. A method, comprising:
   providing a quasi-optic grid array to include an array of differential amplifier unit cells to process input radiation and to produce output radiation; and
   configuring and operating each differential amplifier unit cell to enhance a unit cell gain, wherein the configuring and operating includes:
   (a) providing a first active network driven by an input signal of a given magnitude and polarity, the first network including a signal input port, a signal output port, a feedback tie-in port and a feedback take-off port;
   (b) providing a second active network connected to the first network, the second network including a signal input port, a signal output port, a feedback tie-in port, and a feedback take-off port, and being driven by an input signal that is equal and opposite to the input signal of the first active network;
   (c) applying to the feedback tie-in port of the first active network, via a feedback path, a reinforcing signal derived from the feedback take-off port on one of the active networks of the unit cell; and
   (d) applying to the feedback tie-in port of the second active network, via a feedback path, a reinforcing signal derived from the feedback take-off port on the other one of the active networks of the unit cell.

2. The method of claim 1, wherein each of the feedback paths includes a substantially identical feedback network having a transfer function that causes the reinforcing signal applied to each network to add constructively to the input signal applied to that network within the frequency range of interest.

3. The method of claim 2, wherein
   the reinforcing signal applied to the feedback tie-in port of the first network is derived from the feedback take-off port of the second network, and
   the reinforcing signal applied to the feedback tie-in port of the second network is derived from the feedback take-off port of the first network.

4. The method of claim 3, wherein the feedback tie-in port of each network is internally connected to the signal input port of that network and the feedback take-off port of each network is internally connected to the signal output port of that network.

5. The method of claim 1, wherein
   the reinforcing signal applied to the feedback tie-in port of the first network is derived from the feedback take-off port of the first network and
   the reinforcing signal applied to the feedback tie-in port of the second network is derived from the feedback take-off port of the second network.

6. The method of claim 5, wherein the feedback path of each network includes a substantially identical feedback network and the reinforcing signal applied to the feedback tie-in port is derived via a combination of a frequency dependent phase shift from the active network and an additional frequency dependent phase shift from the feedback network.

7. The method of claim 6, wherein
   the feedback tie-in port of each network is internally connected to the signal input port of that network, and
   the feedback take-off port of each network is internally connected to the signal output port of that network.

8. A device, comprising:
   a quasi-optic grid array to include an array of differential unit cells to process input radiation and to produce output radiation, wherein each differential unit cell includes:
   (a) a first active network having a signal input port, a first amplification stage, a signal output port, a feedback take-off port, a feedback tie-in port and a reference port;
   (b) a second active network substantially identical to the first network and having a signal input port, a second amplification stage, a signal output port, a feedback take-off port, a feedback tie-in port, and a reference port, the second network being connected to the first network via the reference ports;
   (c) a first reinforcing signal path that connects the feedback tie-in port of the first network with the feedback take-off port of the second network; and
   (d) a second reinforcing signal path that connects the feedback tie-in port of the second network with the feedback take-off port of the first network.

9. The device of claim 8, wherein the each of the two reinforcing signal paths includes a feedback network.

10. A differential unit cell for a quasi-optic grid array, comprising:
    (a) a first active network having a signal input port, a first amplification stage, a signal output port, a feedback take-off port, a feedback tie-in port and a reference port;
    (b) a second active network substantially identical to the first network and having a signal input port, a second amplification stage, a signal output port, a feedback take-off port, a feedback tie-in port, and a reference port, the second network being connected to the first network via the reference ports;
    (c) a first reinforcing signal path that connects the feedback tie-in port of the first network with the feedback take-off port of the second network; and
    (d) a second reinforcing signal path that connects the feedback tie-in port of the second network with the feedback take-off port of the first network, wherein the each of the two reinforcing signal paths includes a feedback network, and wherein the first active network includes a second amplification stage connected to the first amplification stage via a coupling impedance network and the second active network includes a second amplification stage connected to the first amplification stage via a coupling impedance network.

11. A device, comprising:
a quasi-optic grid array to include an array of differential unit cells to process input radiation and to produce output radiation, wherein each differential unit cell includes:
   (a) a first active network having a signal input port, a first amplification stage, a signal output port, a feedback take-off port, a feedback tie-in port and a reference port;
   (b) a second active network substantially identical to the first network and having a signal input port, a second amplification stage, a signal output port, a feedback take-off port, a feedback tie-in port and a reference port, the second network being connected to the first network via the reference ports;
   (c) a first reinforcing signal path that connects the feedback tie-in port of the first network with the feedback take-off port of the first network; and
   (d) a second reinforcing signal path that connects the feedback tie-in port of the second network with the feedback take-off port of the second network.

12. The device of claim 11, wherein the each of the two reinforcing signal paths includes a feedback network.

13. The device of claim 12, wherein the first active network includes a second amplification stage connected to the first amplification stage via a coupling impedance network and the second active network includes a second amplification stage connected to the first amplification stage via a coupling impedance network.

14. A device, comprising:
a quasi-optic grid array to include an array of differential unit cells to process input radiation and to produce output radiation, wherein each differential unit cell includes: a first input port for an input signal, a second input port for an input signal that is equal and opposite to the input signal at the first input port, a first output port and a second output port, each differential unit cell further comprising:
   (a) a first three-terminal active device having a control electrode connected to the first input port, an anode connected to the first output port and a cathode; and
   (b) a second three-terminal active device having a control electrode connected to the second input port, an anode connected to the second output port and a cathode connected to the cathode of the first active device in a differential pair configuration,
   wherein the anode of the first active device is connected to the control electrode of the second active device through a first regenerative feedback network and the anode of the second active device is connected to the control electrode of the first active device through a second regenerative feedback network.

15. A device, comprising:
a substrate;
a quasi-optic grid array formed on the substrate to include an array of differential unit cells to process input radiation and to produce output radiation, wherein each differential unit cell includes:
   a first input port for an input signal and a second input port for an input signal that is equal and opposite to the input signal at the first input port, a first output port and a second output port, each differential unit cell further comprising;
   (a) a first three-terminal active device having a control electrode control connected to the first input port, an anode connected to the first output port and a cathode; and
   (b) a second three-terminal active device having a control electrode control connected to the second input port, an anode connected to the second output port and a cathode connected to the cathode of the first active device;
   wherein the anode of the first active device is connected to the control electrode of the first active device through a first regenerative feedback network in a differential pair configuration, and
   the anode of the second active device is connected to the control electrode of the second active device through a second regenerative feedback network.

16. A device, comprising:
a quasi-optic grid array to include an array of differential unit cells to process input radiation and to produce output radiation, wherein each differential unit cell includes:
   (a) a first active network having an input port, an output port and a reference port, the network including at least a first and second amplification stage, each stage including at least one three-terminal, active device having a cathode, an anode and a control electrode; and
   (b) a second active network substantially identical to the first network, having an input port, an output port and a reference port, the network including at least a first and second amplification stage, each stage including at least one three-terminal active device having a cathode, an anode and a control electrode; the second network being coupled to the first network via their respective reference ports.

17. A unit cell for a quasi-optic grid array, comprising:
(a) a first active network having an input port, an output port and a reference port, the network including at least a first and second amplification stage, each stage including at least one three-terminal, active device having a cathode, an anode and a control electrode; and
(b) a second active network substantially identical to the first network, having an input port, an output port and a reference port, the network including at least a first and second amplification stage, each stage including at least one three-terminal active device having a cathode, an anode and a control electrode; the second network being coupled to the first network via their respective reference ports, where within the first network the control electrode of the active device of the first amplification stage is connected to the input port of the network,
the anode of the active device of the second amplification stage is connected to the output port of the network, and
the anode of the active device of the first amplification stage is connected to the control electrode of the active device of the second amplification stage through a coupling impedance network.

18. A unit cell for a quasi-optic grid array, comprising:
(a) a first active network having an input port, an output port and a reference port, the network including at least a first and second amplification stage, each stage including at least one three-terminal, active device having a cathode, an anode and a control electrode; and (b) a second active network substantially identical to the first network, having an input port, an output port and a reference port, the network including at least a first and second amplification stage, each stage including at least one three-terminal active device having a cathode, an anode and a control electrode; the second network being coupled to the first network via their respective reference ports, where within the first network, the control electrode of the first active device is connected to the input port the cathode of the first active device is connected to the reference port, and the anode of the first device coupled to the cathode of the second device through an impedance network; and the control terminal of the second device is connected to a bias voltage through an impedance network.

19. A unit cell for a quasi-optic grid array, comprising:
(a) a first active network, including a first signal input port for receiving an input signal, a first signal output port, a first feedback take-off port and a first feedback tie-in port, and further including
   (i) a first three-terminal active device having a control electrode connected to the signal input port, an anode and a cathode, and
   (ii) a second three-terminal active device having a control electrode internally connected to the anode of the first active device via a coupling impedance network, an anode connected to the signal output port, and a cathode connected to the cathode of the first active device;
(b) a second active network, including a second signal input port for receiving an input signal that is equal and opposite to the first input signal, a second signal output port, a second feedback take-off port and a second feedback tie-in port, and further including
   (i) a third three-terminal active device having a control electrode connected to the second signal input port, an anode and a cathode, and
   (ii) a fourth three-terminal active device having a control electrode internally connected to the anode of the third active device via a coupling impedance network, an anode connected to the second signal output port, and a cathode connected to the cathodes of the first, second and third active devices;
(c) a first reinforcing signal path that connects the second feedback take-off port to the first feedback tie-in port via a first feedback network; and
(d) a second reinforcing signal path that connects the first feedback take-off port to the second feedback tie-in port via a second feedback network, (e) wherein the first feedback take-off port is internally connected to the anode of the first active device, the first feedback tie-in port is internally connected to the control electrode of the first active device, the second feedback takeoff port is internally connected to the anode of the second active device, and the second feedback tie-in port is internally connected to the control electrode of the second active device.

20. A unit cell for a quasi-optic grid array, comprising:
(a) a first active network, including a first signal input port for receiving an input signal, a first signal output port, a first feedback take-off port and a first feedback tie-in port, and further including
   (i) a first three-terminal active device having a control electrode connected to the signal input port, an anode and a cathode, and
   (ii) a second three-terminal active device having a control electrode internally connected to the anode of the first active device via a coupling impedance network, an anode connected to the signal output port, and a cathode connected to the cathode of the first active device;
(b) a second active network, including a second signal input port for receiving an input signal that is equal and opposite to the first input signal, a second signal output port, a second feedback take-off port and a second feedback tie-in port, and further including
   (i) a third three-terminal active device having a control electrode connected to the second signal input port, an anode and a cathode, and
   (ii) a fourth three-terminal active device having a control electrode internally connected to the anode of the third active device via a coupling impedance network, an anode connected to the second signal output port, and a cathode connected to the cathodes of the first, second and third active devices;
(c) a first reinforcing signal path that connects the first feedback take-off port to the first feedback tie-in port via a first feedback network; and
(d) a second reinforcing signal path that connects the second feedback take-off port to the second feedback tie-in port via a second feedback network,
(e) wherein the first feedback take-off port is internally connected to the anode of the second active device, the first feedback tie-in port is internally connected to the anode of the first active device, the second feedback take-off port is internally connected to the anode of the fourth active device, and the second feedback tie-in port is internally connected to the anode of the third active device.

* * * * *

UNITED STATES PATENT AND TRADEMARK OFFICE
CERTIFICATE OF CORRECTION

PATENT NO. : 6,559,724 B2
DATED : May 6, 2003
INVENTOR(S) : James J. Rosenberg et al.

It is certified that error appears in the above-identified patent and that said Letters Patent is hereby corrected as shown below:

<u>Column 1,</u>
Line 16, above "BACKGROUND OF THE INVENTION", please insert the following paragraph:

-- The U.S. Government may have certain rights in this invention pursuant to Grant No. N66001-96-C-8627 awarded by the U.S. Navy. --

Signed and Sealed this

Twenty-second Day of July, 2003

JAMES E. ROGAN
*Director of the United States Patent and Trademark Office*